United States Patent [19]
Connell et al.

[11] Patent Number: 5,565,813
[45] Date of Patent: Oct. 15, 1996

[54] APPARATUS FOR A LOW VOLTAGE DIFFERENTIAL AMPLIFIER INCORPORATING SWITCHED CAPACITORS

[75] Inventors: Lawrence E. Connell, Naperville; Neal W. Hollenbeck, Schaumburg, both of Ill.

[73] Assignee: Motorola Inc., Schaumburg, Ill.

[21] Appl. No.: 440,607

[22] Filed: May 15, 1995

[51] Int. Cl.$^6$ ..................................... H03F 3/45
[52] U.S. Cl. .............................. 330/9; 330/253; 330/261; 327/65
[58] Field of Search ............................ 330/9, 253, 261; 327/65

[56] References Cited

U.S. PATENT DOCUMENTS

| | | | |
|---|---|---|---|
| 4,264,872 | 4/1981 | Suzuki | 327/65 X |
| 4,710,724 | 12/1987 | Connell et al. | 330/9 |
| 5,124,663 | 6/1992 | McEntarfer et al. | 330/9 |

OTHER PUBLICATIONS

Hodges et al., "Potential of MOS Technologies for Analog Integrated Circuits", IEEE J. Solid–State Circuits, vol. SC–13, pp. 285–294, Jun. 1978.

Primary Examiner—James B. Mullins
Attorney, Agent, or Firm—John Gustav Larson

[57] ABSTRACT

A low voltage differential amplifier 10 or comparator is accomplished by providing an differential amplifier 10 that includes a transistor bias simulator 32 and a capacitance circuit 36. The transistor bias simulator 32 matches the gate to source bias voltage of the load transistor 22 and provides this value to the capacitance circuit 36. The capacitance circuit 36, which is coupled to a biasing reference voltage 38, charges a capacitor 84 based on the difference between the biasing reference voltage 38 and the simulated bias voltage 34. This charged capacitor 86 is used during an auto-zeroing phase to bias the drain to source voltage of the load transistor 22 to a state at which it is just beyond the onset of saturation.

15 Claims, 3 Drawing Sheets

1

APPARATUS FOR A LOW VOLTAGE DIFFERENTIAL AMPLIFIER INCORPORATING SWITCHED CAPACITORS

FIELD OF THE INVENTION

The present invention relates generally to differential amplifiers and more particularly to a low voltage differential amplifier or comparator utilizing switched capacitors.

BACKGROUND OF THE INVENTION

Operational amplifiers, as is known, have a multitude of uses. For example, differential amplifiers are used in almost all types of communication equipment such as radios, televisions, short wave radios, etc.. The general function of an differential amplifier is to amplify the difference between two input signals. This is generally done using a differential input comprised of a plurality of transistors.

While differential amplifiers perform the multitude of uses very well, there are some inherent difficulties. For example, in differential amplifier, if the transistors are not identically matched, i.e. having the same gain threshold voltage, saturation voltage, etc., an offset will result causing the output to not be a true representation of the difference between the input signals. To combat this difficulty, auto-zeroing circuits have been designed. One such auto-zeroing circuit is disclosed in U.S. Pat. No. 4,710,724, issued to Lawrence Connell, et al.. In the Connell reference, a capacitor is coupled in series with the inputs wherein the capacitor stores an offset voltage due to the transistor mismatching. To establish the voltage across the offset storing capacitors, the inputs are switched between the actual inputs being amplified, or compared, and a reference voltage. When the inputs are coupled to the reference voltage, the load transistors of the amplifier circuit, are coupled to the output such that any offset voltages between the output legs will be absorbed, or stored in the offset storing capacitors.

The differential comparator of Connell, et al. works very well in many applications. However, as portable electronic devices strive for greater battery life, the push for lower voltage applications is a critical issue. Typically, the supply voltage needed by an application is determined by the voltage biasing of the components in series with the supply voltage (Vdd) and ground. The biasing voltages of the prior art are shown in FIG. 1. The biasing is such that the voltage across transistor 4 (Vds) and transistor 6 is equal to a threshold voltage (Vt) and a drain to source saturation voltage (Vdsat) (Vt+Vdsat). The drain to source voltage across transistor 2, which acts as a current source, is a drain to source saturation voltage (Vdsat). The total voltage across these three devices represents the minimum needed supply voltage, and is represented by the equation:

Minimum Vdd=Transistor 2 Vds+Transistor 4 Vds+Transistor 6 Vds

Substituting the referenced values:

Minimum Vdd=(Vdsat)+(Vt+Vdsat)+(Vt+Vdsat) =2(Vt)+3(Vdsat).

Typically, Vt will have a value of 0.7 V and range from 0.6 V to 0.8 V. While, Vdsat will have a typical value of 0.15 V and a range from 0.1 V to 0.2 V. Substituting these values into the above equation shows that a Vdd of 1.85 V will be needed in a typical situation. In a worse case situation a Vdd of 2.2 V is needed, while, in a best case situation a Vdd of 1.5 V will be needed. The prior art requires a Vdd of between 1.5 V and 2.2 V. Therefore, a need exists for a differential amplifier, or comparator, circuit that operates at or below a voltage source that is 1.5 V.

DETAILED DESCRIPTION OF THE DRAWINGS

Generally, the present invention provides an differential amplifier, or comparator circuit, that operates at low supply voltages (1.5 volts or less). This is accomplished by providing a differential amplifier that includes a transistor bias simulator and a capacitance circuit. The transistor bias simulator produces the desired gate to source bias voltage of the load transistors and provides this value to the capacitance circuit. The capacitance circuit, which is coupled to a reference voltage, charges a capacitor based on the difference between the reference voltage and the simulated bias voltage. This charged capacitor is used during an auto-zeroing clock phase to bias the drain to source voltage of the load transistor to a state at which it is just beyond the onset of saturation. By biasing the drain to source voltage, the supply voltage needed to operate the amplifier or comparator circuit is significantly lower that the prior art.

Figure 2:
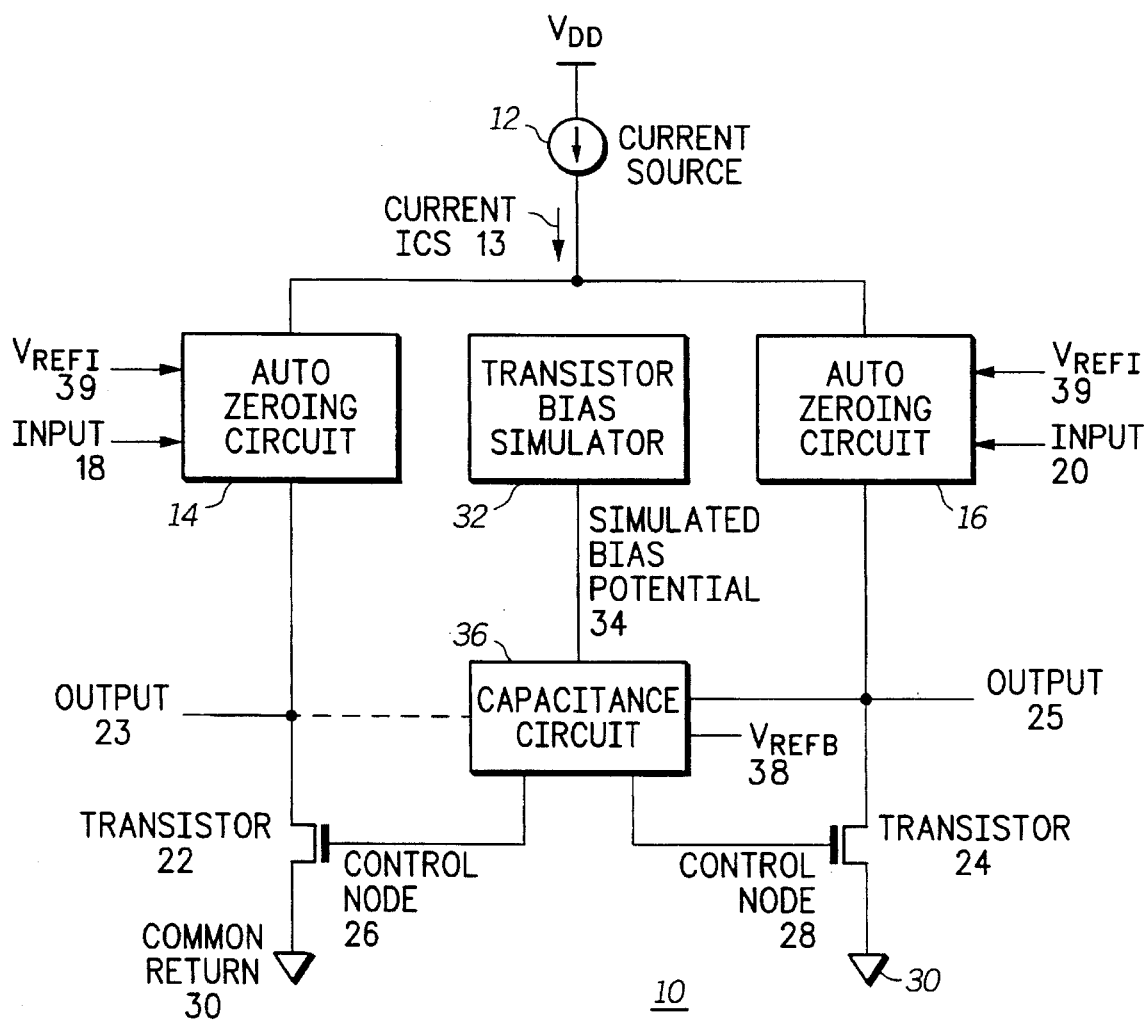
FIG. 2 illustrates, in a schematic block diagram, an differential amplifier or comparator in accordance with the present invention.

FIG. 2 illustrates a schematic representation of a low voltage differential amplifier 10, or comparator, in accordance with the teaching of the present invention. As shown, the differential amplifier 10 includes a current source 12, a pair of auto-zeroing circuits 14 and 16, a transistor bias simulator 32, a capacitance circuit 36, a pair of transistors 22 and 24, and receives reference potentials Vrefb 38, Vrefi 39, and a pair of input signals 18 and 20.

The current source 12, in a conventional manner, provides a fixed amount of current Ics 13 to the differential amplifier 10, and specifically to the transistors 22 and 24. In operation, the actual distribution of Ics 13 is determined by inputs 18 and 20. A voltage difference on the inputs 18 and 20 will cause one of the auto-zeroing circuits 14 or 16 to draw a greater portion of the Ics 13 current than the other auto-zeroing circuit 16 or 14. The difference in current flow also occurs in transistors 22 and 24, which in a preferred embodiment have a common gate to source bias provided by the capacitance circuit, as discussed later. For example, if auto-zeroing circuit 16 is drawing more current than auto-zeroing circuit 14, transistor 24, in series with auto-zeroing circuit 16, will draw the same amount of current as auto-zeroing circuit 16. In a similar manner, transistor 22, in series with auto-zeroing circuit 14, will draw the same amount of current as auto-zeroing circuit 14. The increased current through transistor 24, which is acting as a load transistor, increases the drain to source voltage across transistor 24, which represents output 25. The differential amplifier gain will depend on the drain to source impedance of the transistors 22 and 24. In the preferred embodiment, the differential amplifier 10 is functioning as a comparator, thereby, requiring high drain to source impedance from transistors 22 and 24, such that slight differences in current through transistor 22 or transistor 24 will generate a large output voltage swing. Note, in the preferred embodiment, transistor 22 and transistor 24 are identical, i.e. have the same transistor characteristics.

The capacitance circuit 36 is coupled to output 25 (and output 23 for a differential output embodiment), control nodes 26 and 28, and receives the simulated bias potential 34, and a biasing voltage reference Vrefb 38. The capacitance circuit provides a common gate to source bias to transistor 22 and transistor 24, through control nodes 26 and 28 respectively. This common gate to source bias, as generated by the transistor bias simulator, is chosen to assure transistor 22 and transistor 24 have a high drain to source impedance; this assures a high differential amplifier voltage gain for a small change in drain to source current. The preferred embodiment sets the biasing reference voltage Vrefb to be equal to the transistor 22 threshold voltage Vt plus its saturation voltage Vdsat (Vdsat+Vt). In addition, the capacitance circuit 36 provides a drain to source bias voltage (Vds) to at least transistor 22. In a preferred embodiment, the drain to source bias voltage Vds would be provided to the drain of both transistors 22 and 24.

In the prior art, a gate to drain switch provided a drain to source Vds bias level equal to the transistor 22 threshold voltage Vt plus its saturation voltage Vdsat (Vdsat+Vt). While the prior art drain to source voltage would guarantee high output impedance, it had a relatively high Vds of between 0.7 and 1.0 volts: this being a limitation of the prior art for low voltage applications. The capacitance circuit in the present invention provides a drain to source bias level equal to Vdsat plus a voltage delta (Vdsat+Vdelta), where Vdelta is a voltage potential which is smaller than Vt, and large enough to assure operation in a high gain region. One skilled in the art will recognize this value to be at or below 100 millivolts. This embodiment provides a Vds less than the prior art, generally Vds is between 0.1 and 0.3 volts, thus overcoming one of the limitations of the prior art.

Figure 3:
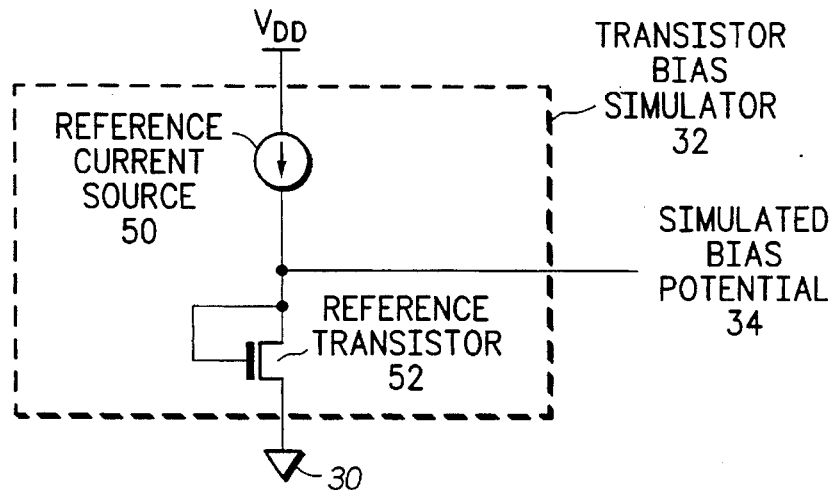
FIG. 3 illustrates, in a schematic diagram, the transistor bias simulator of FIG. 2.

FIG. 3 illustrates a more detailed schematic representation of the transistor bias simulator 32. As shown, the transistor bias simulator 32 includes a reference current source 50 and a reference transistor 52. The reference current source is coupled to the supply voltage (VDD) 11 and the reference transistor 52 is coupled to the common return 30. The simulated bias potential 34 is provided at the drain of the reference transistor 52. The reference transistor 52 is selected to be a scaled representation of transistor 22. This scaling may be a one to one scaling (i.e., they are identical transistors), or a scaled representation such that power consumption can be reduced. In addition, the reference transistor's 52 gate and drain share a common node. In this configuration, the simulated bias voltage is the reference transistor's threshold voltage (Vt) plus its saturation voltage (Vdsat), (Vdsat+Vt).

Figure 4:
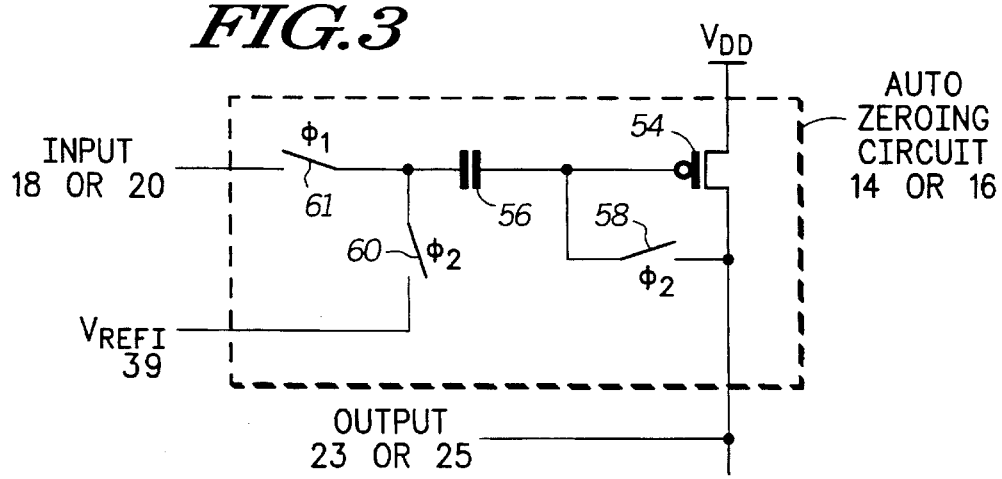
FIG. 4 illustrates, in a schematic representation, the capacitor circuit coupled to the transistors of FIG. 2.
Figure 5:
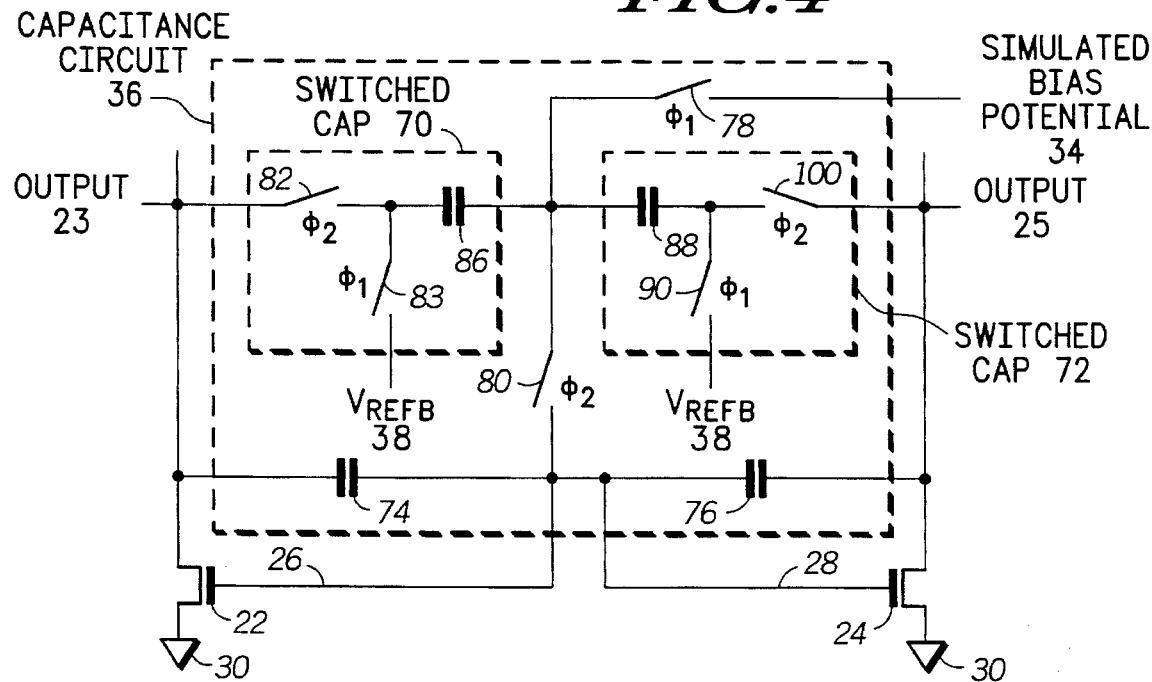
FIG. 5 illustrates, in a schematic representation, the auto-zeroing circuits of FIG. 2.

A clock signal with a first phase ϕ1 and a second phase ϕ2, where the first phase can be referred to as the non-auto-zeroing phase, while the second phase can be referred to as the auto-zeroing phase. The relationship of ϕ1 and ϕ2 is such that they are mutually exclusive. For example, when ϕ1 is in an active state, ϕ2 will be in an inactive state. The clock signal controls switches in auto-zeroing circuits 14 and 16, and the capacitance circuit 36, as shown in FIG. 4 and FIG. 5. The control of these switches, as will be discussed, provides the biasing of transistors 22 and 24.

FIG. 5 illustrates a more detailed schematic representation of the preferred embodiment of capacitance circuit 36. As shown, the capacitance circuit 36 includes a pair of switched capacitor circuits 70 and 72, a pair of switches 78 and 80, and a pair of capacitors 74 and 76. As shown, the switched capacitor circuit 70 is coupled to the output 23, the common node of switches 78 and 80, and receives the reference voltage Vrefb 38. Likewise, the switched capacitor circuit 72 is coupled to the output 25, the common node of switches 78 and 80, and receives the reference voltage Vrefb 38. Capacitors 74 and 76 are connected in series between the drain of transistor 22 and the drain of transistor 24. Switch 78 and switch 80 share a common node. Switch 78 is further connected to the simulated bias potential 34; while switch 80 is connected to the shared node of capacitors 74 and 76 as well as the gate of transistor 22 and the gate 28 of transistor 24. During the non-auto-zeroing phase, capacitors 74 and 76 serve to provide output common mode feedback to transistor 22 and 24. The switched capacitor circuit 70 consists of a switch 82 and a switch 83 connected to a common node of capacitor 86. Switch 82 is connected to the output 23, and is controlled by ϕ2, while switch 83 is connected to the Vrefb, and is controlled by 01. In an identical manner, switched capacitor circuit 72 connects switch 90, switch 100 and a capacitor 88. Whereby, switch 90 is connected to Vrefb, and is controlled by ϕ1, and switch 100 is connected to the output 25, and is controlled by ϕ2.

In operation, during the non-auto-zeroing phase ϕ1, capacitor 86 is connected to the simulated threshold potential 34 and to potential Vrefb 38 through switches 78 and 83 respectively. During this phase, capacitor 84 is charged to the difference between the simulated bias potential 34 and the voltage reference Vrefb 38. Similarly, capacitor 88 of switched capacitor 72 is charged to a substantially identical voltage through switch 78 and switch 90. During clock phase 2 (ϕ2), or the auto-zeroing clock phase, the output 23 is coupled to capacitor 86 through switch 82, of the switched capacitor 70. Similarly, the output 25 of transistor 24 is coupled to capacitor 88 through switch 100, of the switched capacitor 72. Also during 02, the common node of the switched capacitor 70 and 72 is coupled to the control nodes 26 and 28 of the load transistors 22 and 24 through switch 80. In this configuration, energy stored in capacitors 86 and 88 is transferred to capacitors 74 and 76, allowing the potential at the control nodes 26 and 28 to remain at the simulated bias potential. The potential at the output node 23, during the auto-zeroing phase, will be the simulated bias potential plus the potential developed across capacitor 74. The voltage at the drain of transistor 22, also output 23, is represented by the following equation:

Vd=simulated bias potential+Capacitor 74 potential.

Where,

Simulated bias potential=Vdsat+Vt

Capacitor 74 potential=Vrefb—Simulated bias potential

Vrefb=Vdsat+Vdelta.

Substituting and solving gives:

$$Vd = (Vdsat + Vt) + ((Vdsat + Vdelta) - (Vdsat + Vt))$$
$$= Vdsat + Vt + Vdsat + Vdelta - Vdsat - Vt$$
$$= Vdsat + Vdelta = Vrefb$$

Figure 1:
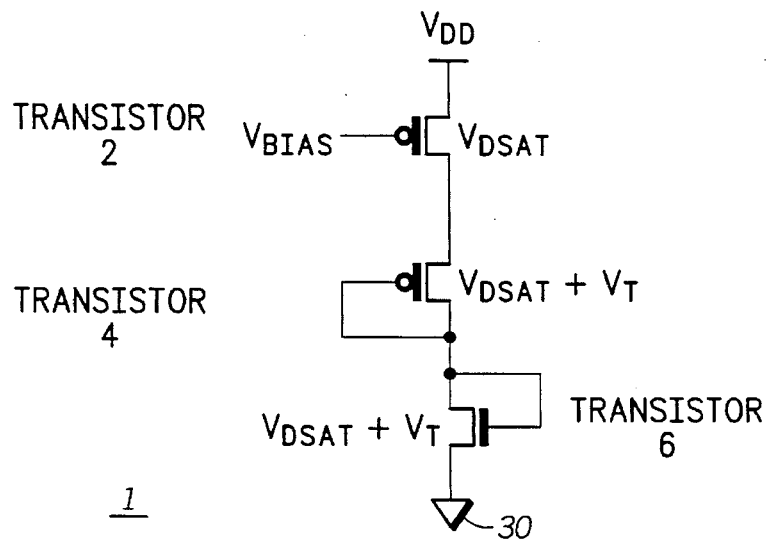
FIG. 1 illustrates, in a schematic diagram, a prior-art circuit showing the Vdd value required by a prior art circuit.

This indicates that the value of Vd during the auto-zeroing phase is equal to the value of Vrefb. By choosing the value for Vrefb to be Vdsat+Vdelta, the intent of the invention is met by providing a supply voltage operation below 1.5 V. The preferred embodiment chooses Vdelta to be 100 millivolts. This will set the drain to source voltage to Vdsat+100 mv, providing low voltage across transistor 22, while still assuring high gain. Referring to prior art FIG. 1, the drain to source voltage across transistor 6 becomes Vdsat+Vdelta. By comparing a preferred Vdelta value of 0.1 volts to the range of Vt values, 0.6 V to 0.8 V, it is demonstrated that the present invention will operate at a voltage of 0.5 V to 0.7 V below the prior art circuit.

FIG. 4 illustrates a schematic representation of the auto-zeroing circuits 14 or 16. As shown, the auto-zeroing circuit 14, 16 includes a P-channel FET 54, three switches 58, 60, 61, and a capacitor 56. As shown, the capacitor 56 is attached on one node to switches 60 and 61, and on the other node to switch 58 and to the gate of transistor 54. Switch 61 couples input 18 or 20 to the capacitor 56 and is controlled by the non-auto-zeroing clock phase φ1. Switch 60 couples the voltage reference 39 to capacitor 56, and is controlled by the auto-zeroing clock phase φ2. Switch 58 couples the node common to capacitor 56 and the gate of transistor 54 to the drain of transistor 54, and is controlled by φ2.

In operation, during the auto-zeroing clock phase (φ2), switch 58 connects the gate and drain of transistor 54. This provides a drain to source voltage Vds voltage, to transistor 54, of Vdsat+Vt. Also during φ2, the input side of capacitor 56 will be biased to an input voltage reference Vrefi through switch 60. As one skilled in the art will recognize, Vrefi is the voltage to which inputs 18 and 20 are compared. This, in effect, provides an appropriate bias level to the system using the differential amplifier 10. During the non-auto-zero mode, the input 18, 20 signal will be capacitively coupled to the gate of transistor 54, providing a differential input voltage to auto-zeroing circuit 14 and auto-zeroing circuit 16 for amplification by the differential amplifier 10.

Figure 6:
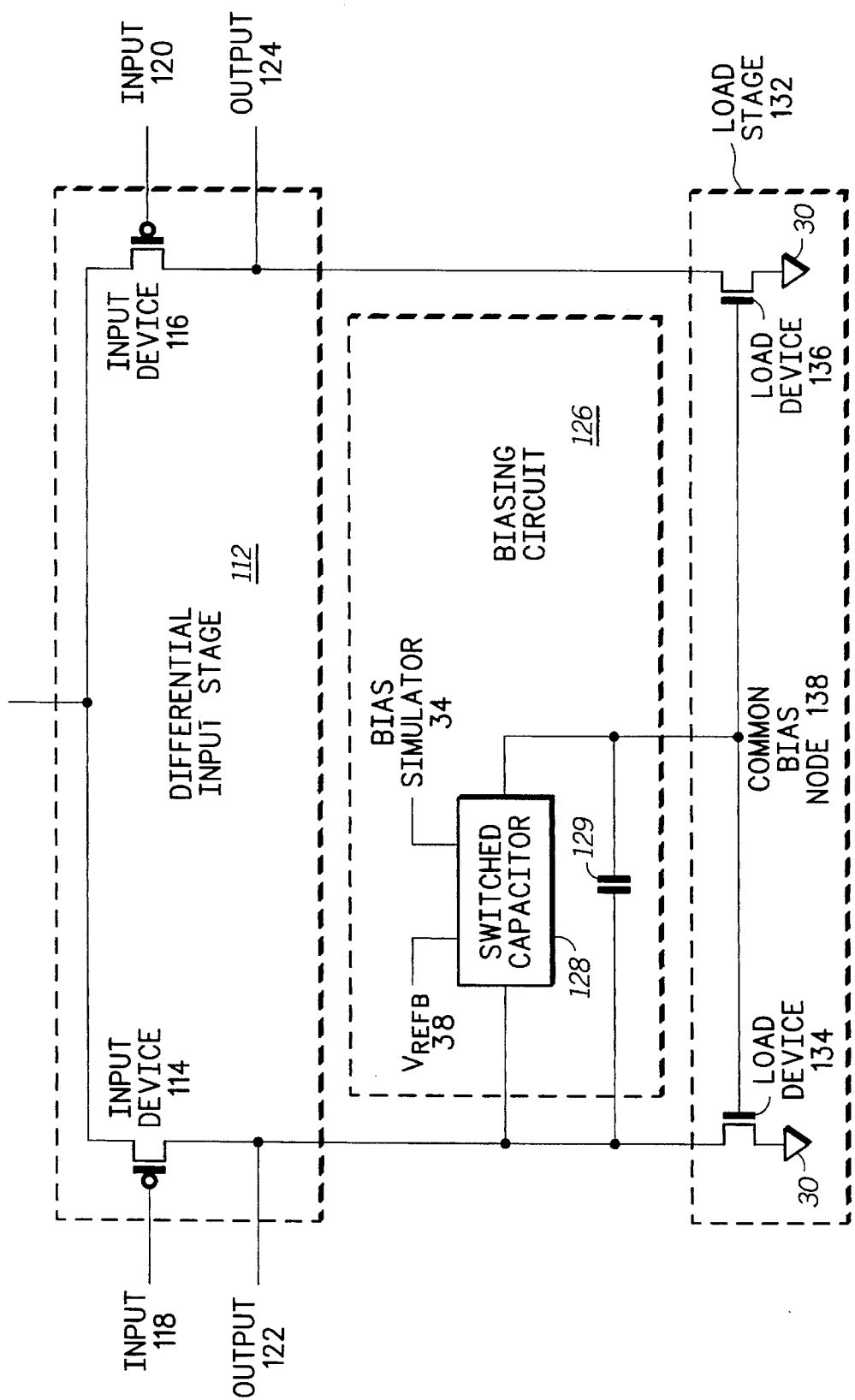
FIG. 6 illustrates, in a schematic block diagram, an alternate embodiment of an amplifier or comparator in accordance with the present invention.

FIG. 6 illustrates an alternate embodiment for the amplifier, or comparator circuit of the present invention. As shown, the differential amplifier 110 includes a differential input stage 112, coupled to a biasing circuit 126 which is in turn coupled to a load stage 132. The differential input stage includes a pair of input devices 114 and 116 which may be P-channel FETs or N-channel FETs and each receiving an input 118 and 120. Note that if P-channel transistors are used, the common node between the input devices 114 and 116 is coupled to a source voltage through a current source while if the input devices 114 and 116 are N-channel devices, they will be coupled to a common return voltage. The input differential stage further includes a pair of outputs 122 and 124 which are shown connected to the drains of input devices 114 and 116.

The biasing circuit 126, which includes a switched capacitor circuit 128, is coupled to at least output 122 and the common biasing node 138 of the load stage. In addition, the switched capacitor circuit 128 is coupled to a bias simulator 34 and the reference voltage Vrefb 38. The operation of the switched capacitor circuit 128 is identical to that previously discussed with reference to FIG. 4. Note that the biasing circuit may also include a second switched capacitor circuit coupled in a similar manner, but to the second output 124.

The load stage includes a pair of load devices 134 and 136. When the input devices 114 and 116 are P-channel FETs, the load devices will be N-channel FETs being common coupled to the common return 30 as shown. Conversely, when the input devices are N-channel FETs, the load devices will be P-channel FETs, wherein their common source connection will be to a voltage source. The control nodes, or gates of the load devices 134 and 136, are coupled together at the common biasing node which is coupled to the biasing circuit 126. Operation of the differential amplifier 110 of FIG. 6 is similar to that of the discussion of differential amplifier 10.

One skilled in the art will readily appreciate that the biasing circuit includes the transistor threshold circuit 32 and the capacitance circuit 36. As such, the differential amplifier 110 may be configured to operate as an amplifier, or a comparator, with a single or dual mode output.

The present invention provides an differential amplifier, or comparator circuit, that operates from a supply voltage of 1.5 V or less. This is accomplished by providing a biasing circuit, or capacitance circuit, which during an auto-zeroing phase biases the load transistors into saturation such that the series combination of the current source, the input transistor devices, and the load transistor devices has a voltage drop of 1.5 volts or less. The present invention reduces the supply voltage need by 0.5 to 0.7 volts over prior art circuits, by driving the load transistors to just beyond the onset of saturation in the auto-zeroing phase φ2, thereby solving limitations of the prior art.

We claim:

1. A low voltage differential amplifier comprising:

a current source;

a first auto-zeroing circuit operably coupled to the current source, wherein the first auto-zeroing circuit includes a first data input, and an input voltage reference;

a second-auto-zeroing circuit operably coupled to the current source, wherein the second auto-zeroing circuit includes a second data input, and the input voltage reference;

a first transistor having a first control node, wherein the first transistor is operably coupled to the first auto-zeroing circuit and to a common reference, wherein coupling of the first transistor to the first auto-zeroing circuit provides a first transistor output node for the low voltage differential amplifier;

a second transistor having a second control node, wherein the second transistor is operably coupled the second auto-zeroing circuit, the first control node, and to the common reference, wherein the coupling of the second transistor to the second auto-zeroing circuit provides a second transistor output node for the low voltage differential amplifier;

a transistor bias simulator that generates a simulated bias potential; and a capacitance circuit operably coupled to the simulated bias potential, the first transistor output node, the first control node, the second control node, and a biasing reference voltage, whereby the capacitance circuit operably biases the first transistor.

2. The low voltage differential amplifier of claim 1, wherein the first transistor and the second transistor are substantially identical.

3. The low voltage differential amplifier of claim 1, wherein the simulated bias potential is substantially identical to a potential required to bring the first transistor into saturation.

4. The low voltage differential amplifier of claim 1, wherein the biasing reference voltage is less than the threshold voltage of the first transistor.

5. The low voltage differential amplifier of claim 1, wherein the transistor bias simulator comprises a reference current source and a reference transistor.

6. The low voltage differential amplifier of claim 5, wherein the reference current source comprises a scaled representation of the current source and the reference transistor is a scaled representation of the first transistor.

7. The low voltage differential amplifier of claim 6, wherein the reference current source comprises a less than one-to-one scaled representation of the current source and the reference transistor comprises a one-to-one scaled representation of the first transistor.

8. The low voltage differential amplifier of claim 1 comprising a clock signal input that receives a clock signal having a first clock phase and a second clock phase.

9. The low voltage differential amplifier of claim 8, wherein the capacitance circuit comprises a switched capacitor circuit, and a non-switched capacitor circuit, whereby the non-switched capacitor circuit is operably coupled to the switched capacitor circuit during the second clock phase, and the non-switched capacitor circuit provides common mode feedback for the first transistor and the second transistor.

10. The low voltage differential amplifier of claim 9, wherein the switched capacitor circuit comprises a plurality of switched capacitor circuits.

11. A low voltage differential amplifier comprising:

a first auto-zeroing circuit operably coupled to receive a first input;

a second auto-zeroing circuit: operably coupled to receive a second input;

a first load transistor operably coupled to the first auto-zeroing circuit, wherein an interconnecting node between the first load transistor and the first auto-zeroing circuit provides a comparison output;

a second load transistor operably coupled to the second auto-zeroing input;

a biasing circuit operably coupled to the first load transistor and the second load transistor, wherein the biasing circuit biases the first load transistor and the second load transistor into saturation during an auto-zeroing clock phase.

12. The low voltage amplifier of claim 11, wherein the biasing circuit comprises a first switched capacitor circuit, a second switched capacitor circuit, a voltage reference, and a saturation bias circuit, wherein the first switched capacitor circuit and the second switched capacitor circuit are operably coupled to the voltage reference and the saturation reference circuit during a non-auto-zeroing clock phase.

13. The low voltage amplifier of claim 12 wherein the saturation reference circuit further comprises a reference current source coupled in series to a reference transistor.

14. The low voltage amplifier of claim 12, wherein the biasing circuit further comprises a first capacitor operably coupled to the first switched capacitor circuit, and a second capacitor operably coupled to the second switched capacitor circuit.

15. A low voltage differential amplifier comprising:

a differential input stage including a pair of input devices connected in a differential amplifier configuration to provide a pair of input terminals and a pair of output terminals;

a load stage including a pair of load devices connected to the pair of output terminals, each of the load devices having a control terminal connected to a common bias node; and a biasing circuit including a first switched capacitor connecting to the common bias node and at least one of the pair of output terminals, wherein the biasing circuit biases a common mode voltage at the pair of output terminals to a reference voltage, and wherein the reference voltage is less than the common bias node voltage of the pair of load devices.

* * * * *